United States Patent [19]

Piganeau

[11] Patent Number: 4,636,828
[45] Date of Patent: Jan. 13, 1987

[54] OPTICAL IMMERSED TYPE PHOTOVOLTAIC DETECTOR

[75] Inventor: Thierry Piganeau, Paris, France
[73] Assignee: Societe Anonyme de Telecommunications, France
[21] Appl. No.: 596,389
[22] Filed: Apr. 3, 1984
[30] Foreign Application Priority Data
  Apr. 8, 1983 [FR] France ................... 83 05800
[51] Int. Cl.⁴ ............... H01L 27/14; B23K 1/19; B23K 35/36
[52] U.S. Cl. ................... 357/30; 357/61; 228/263.11; 228/263.12
[58] Field of Search ............. 357/61, 63, 30; 228/123, 263.11, 263.12

[56] References Cited

U.S. PATENT DOCUMENTS 3,371,213  2/1968  Adams et al. ............ 357/30
4,024,397  5/1977  Weiner .................. 250/338
4,435,224  3/1984  Durand .................. 357/61

OTHER PUBLICATIONS

Lanin et al., "Backside-Illuminated HyCdTe/CdTe Photodiodes", Jan. 1, 1979, *Applied Physics Letters*, 34(1); pp. 50–52.

*Primary Examiner*—James W. Davie
*Assistant Examiner*—Georgia Y. Epps
*Attorney, Agent, or Firm*—Jacobs & Jacobs

[57] ABSTRACT

The invention relates to an immersed type photovoltaic detector comprising a substrate transparent to infrared radiations and a wafer in semiconducting material. A PN junction is formed in the wafer, on the side opposite the substrate, with a zone of conductivity opposite that of the rest of the wafer. The substrate, on the side opposite the wafer, has the form of a hemispherical lens. The substrate and the wafer are welded by a layer of tellurium transparent to infrared radiations after dissolution by the tellurium of the substrate and of the wafer. The detector is advantageously used for the evaluation of lenses.

4 Claims, 2 Drawing Figures

OPTICAL IMMERSED TYPE PHOTOVOLTAIC DETECTOR

BACKGROUND OF THE INVENTION

The present invention relates to an immersed type photovoltaic detector sensitive to infrared radiation, comprising a substrate transparent to the infrared radiations; on one side of the substrate, a wafer of semiconducting material of a first type of conductivity; in this wafer, on the side opposite the substrate, at least one zone of a second type of conductivity forming, with the material of the first type, a PN junction; the substrate on the side opposite the wafer being machined in the form of a lens.

A detector of this type is already known, particularly by Applicants' French Patent Application No. 79.29470.

Such detectors are being produced at the present time with a substrate in CdTe and a wafer in $Hg_{1-x}Cd_xTe$, which is an alloy of CdTe, a material with a wide forbidden band, and of HgTe, a semi-metal meterial, and of which the wave-length of detection depends on the value of x. The detectivity of these detectors, defined by the signal-to-noise ratio and which is representative of their performances, is limited, in certain cases, only by their thermal noise or their capacitive noise, without being influenced by the ambient background and its fluctuations. These infrared photodetectors not limited by the ambient background are called non-BLIPs (Background limited infrared photodetectors). They are used in particular in the military field for the evaluation of lenses or for telemetry. To increase the level of the signal whilst maintaining that of the noise constant is the same as increasing the detectivity. This is what is obtained by optical immersion, by increasing the apparent surface of the detector proper.

This apparent surface may be multiplied by $n^2$, n representating the index of the lens, if the detector is placed at the centre of a hemispherical lens, or by $n^4$, if the detector is placed at the first Weierstrass point of a hyperhemispherical lens, extending beyond the centre of the corresponding sphere.

As to the detectivity itself, it is multiplied by n in case of hemispherical immersion and by $n^2$ in case of hyperhemispherical immersion, if it is limited only by the thermal noise, and by $n^2$ in case of hemispherical immersion and by $n^4$ in case of hyperhemispherical immersion, if it is limited only by the capacitive noise.

Finally, optical immersion makes it possible to make detectors operating at intermediate temperature or at high electrical frequency, with performances higher than those of the non-immersed detectors, under the same conditions.

Two processes are known at present for making these immersed detectors.

In a first process, a detector made elsewhere is purely and simply glued on a lens.

In the second process, interdiffusion is effected of a wafer of the material of the first type of conductivity evoked hereinabove and of the substrate of the lens, after having thinned the wafer in question, in which the detector is then made, and before machining the substrate in the form of a lens. It should be noted here that, with such a process, only a detector with illumination by the rear face can be produced.

The first process, employing glue, presents several drawbacks. The glue, which constitutes an intermediate medium of low refraction index, limits, by total reflexion, the field of view of the detector. In addition, it is not easy to choose a glue which satisfies, simultaneously, the requirements of index, as has just been mentioned, of infrared radiation transmission, the coefficients of thermal expansion, mechanical solidity, rate of degassing, etc.

The second process, by interdiffusion, also poses a problem, even if it presents the advantage of eliminating the "index jump" provoked, in the first case, by the glue. In fact, the interdiffusion requires treatment at high temperatures, generally of the order of 600° C., which makes it possible to produce a mosaic of diodes which are all equally satisfactory.

It is therefore an object of the present invention to propose a detector of the type mentioned hereinabove but not presenting the drawbacks of those produced by the heretofore known processes.

SUMMARY OF THE INVENTION

To this end, the detector according to the invention, of the type mentioned hereinabove, is characterized in that it comprises, interposed between the substrate and the wafer, an agent transparent to infrared radiation and constituting a solvent of the substrate and of the wafer.

Thus the substrate and the wafer are joined, no longer by glue, but by a bonding or welding solvent, transparent to infrared radiations, this eliminating the drawbacks of the glue.

In a preferred embodiment of the detector according to the invention, the bonding agent is an agent with a relatively low melting point, advantageously at the most equal to about 500° C., lower than the temperatures of interdiffusion of the substrate and the wafer, evoked hereinabove, this therefore eliminating the drawbacks of the process of interdiffusion.

The bonding agent is advantageously tellurium, which presents the optimum characteristics for "welding", over some microns of depth, a substrate in CdTe and a wafer in $Hg_{1-x}Cd_xTe$:

good solvent of CdTe and HgTe;

melting point of 449° C., neither too high, as it is lower than the temperature of interdiffusion of 600° C., nor too low, contrary to that of 220° C. of selenium, a temperature of treatment of the order of 300° C. nevertheless being necessary after bonding;

transparency to infrared radiation, particularly for a wave-length of 10.6 μm;

considerable field of view, the small thickness of the layer of tellurium enabling the oblique rays to pass through damped waves;

good constitution, contrary to cadmium which is pulverulent;

good wettability, contrary to selenium.

BRIEF DESCRIPTION OF THE DRAWINGS

The invention will be more readily understood on reading the following description with reference to the accompanying drawings, in which.

DETAILED DESCRIPTION OF A PREFERRED EMBODIMENT OF THE INVENTION

Figure 1:
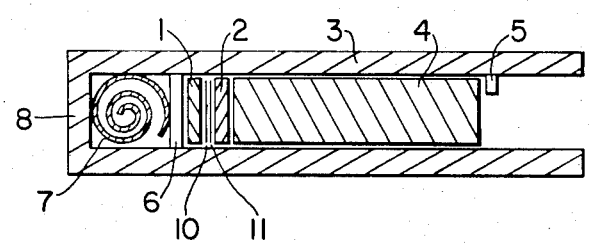
FIG. 1 schematically shows in section a bulb for bonding the substrate and the wafer of the detector according to the invention, and FIG. 2 schematically shows the immersed detector according to the invention, in perspective.

Referring now to the drawings, a conventional substrate 1, in the present case in CdTe, transparent to infrared radiations, on the one hand, and a likewise conventional wafer 2 in semiconducting material, in the present case $Hg_{1-x}Cd_xTe$, on the other hand, are taken to make the detector according to the invention. It will be noted that the value of x is preferably between 0.20 and 1. The surfaces of the substrate 1 and of the wafer 2 to be welded against each other are polished very carefully in order to obtain surface states which are as perfect as possible, for the purposes of cleanliness.

A thin film of tellurium about 1 micron thick is then deposited on each of these surfaces, by cathode sputtering.

Substrate 1 and wafer 2 are introduced into a quartz bulb 3, being applied against each other, with the two films of tellurium 10, 11 in contact with each other, between a quartz piston 4, in abutment against a retractable stop 5, and a bearing plate 6, pushed towards the piston 4 by a molybdenum spring 7 itself in abutment against the bottom 8 of the bulb and maintaining the whole under mechanical pressure.

A small quantity of mercury is preferably introduced into the bulb, such quantity depending on the free space remaining in the bulb for a pressure of mercury of 1 atmosphere to prevail at 500° C. during bonding of the substrate and the wafer which will be referred to hereinbelow. In this respect, it should be noted that operation may also be carried out without pressure of mercury at an even lower temperature. However, the degradation of the material HgCdTe, by exhaust of Hg, would be the same as in the presence of a pressure of Hg at high temperature.

The air contained in the bulb is pumped under secondary vacuum (about $1.3310^{-3}$ millibars) for a few hours, and bulb 3 is sealed on piston 4.

The bulb 3, containing the assembly 1, 10, 2, 11 to be welded, is then introduced into an oven at 500° C. where it is left for about one hour, i.e. for a period sufficient for the assembly to be heated up but not too much for the subsequent absorption of radiations, during illumination by the rear face, which will be referred to hereinbelow, not to be too considerable, then the bulb and its contents are withdrawn, cooled, opened and the substrate and the wafer are removed.

During the heat treatment at 500° C., the tellurium has dissolved the substrate and the wafer, provoking over a small depth of about 5 to 10 $\mu$m the bond or weld of the substrate and wafer. By way of comparison, in the case of conventional interdiffusion, the gradient of composition extends over a much greater thickness of about 30 $\mu$m.

Wafer 2 in $Hg_{1-x}Cd_xTe$ is then thinned parallel to the plane of bond up to a thickness of about 20 to 30 $\mu$m. A zone 12 of conductivity type (p or n) opposite that (n or p) of the starting material of the wafer is diffused, in conventional manner, to make a junction with illumination by the rear face.

Figure 2:
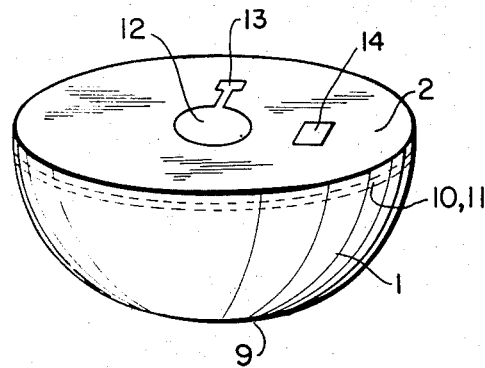

Finally, the substrate 1 on the side opposite the wafer 2 is machined to form a hemispherical lens, as in the case of FIG. 2, or a hyperhemispherical lens well known to the man skilled in the art, and an anti-reflection layer, also well known, is applied on the convex surface 9 of the CdTe lens in order to limit optical losses by reflection on this surface. The detector is completed, likewise in conventional manner, by forming the metallic contact 13 of zone 12 and the metallic contact 14 of the material of the opposite conductivity type.

In this way, a bond is made, at low temperature, having enabled an immersed detector to be obtained whose field of view (FOV) is not limited by the reflexions of the incident radiations on an intermediate medium of low index.

It will be noted that treatment at low temperature makes it possible, on the same substrate, to produce a mosaic of diodes all equally satisfactory, although only one has been shown on the substrate of FIG. 2. The possibility of being reproduced in a large quantity from the same substrate is a very advantageous feature of the detector described hereinabove.

In the case of the hemispherical lens in CdTe of FIG. 2, of index n=2.7, the apparent sensitive surface is multiplied by a factor of about 7. This is most advantageous for example for evaluations of lenses or in telemetry.

In the case of a detector operating in thermal detectivity, i.e. a detector whose performances are limited only by its thermal noise, for a determined apparent sensitive surface, the real surface may therefore be decreased by dividing it by a factor 7, and the termal noise may therefore be divided and the detectivity consequently multiplied by a factor 2.7.

In the case of a detector operating in wide-band detectivity—this is the modulation frequency band—i.e. a detector whose performances are limited only by its capacitive noise, for a determined apparent sensitive surface, the real surface may therefore be decreased by dividing it by a factor 7, and the capacitive noise may therefore be divided and the detectivity multiplied by the same factor 7.

What is claimed is:

1. In an optically immersed photovoltaic detector sensitive to infrared radiation, the improvement comprising a substrate transparent to infrared radiation, a wafer of semiconducting material of a first type of conductivity on one side of said substrate; said wafer having on the side opposite said substrate at least one zone of a second type of conductivity forming, with said material of said first type, a PN junction; said substrate, on the side opposite said wafer, being machined in the form of a lens, and a bonding agent transparent to infrared radiation and constituting a solvent of said substrate and of said wafer is interposed between and bonding said substrate and said wafer.

2. The detector of claim 1, wherein said bonding agent is an agent with a low melting point.

3. The detector of claim 2, wherein said bonding agent is an agent with a high index of refraction.

4. The detector of claim 3, wherein said bonding agent is tellurium.

* * * * *